(12) United States Patent
Jasa et al.

(10) Patent No.: US 8,179,151 B2
(45) Date of Patent: May 15, 2012

(54) METHOD AND SYSTEM THAT DETERMINES THE VALUE OF A RESISTOR IN LINEAR AND NON-LINEAR RESISTOR SETS

(75) Inventors: Hrvoje Jasa, Scarborough, ME (US); Gregory A. Maher, South Portland, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 876 days.

(21) Appl. No.: 12/196,552

(22) Filed: Aug. 22, 2008

(65) Prior Publication Data

US 2009/0251156 A1 Oct. 8, 2009

Related U.S. Application Data

(60) Provisional application No. 61/042,340, filed on Apr. 4, 2008.

(51) Int. Cl.
*G01R 27/08* (2006.01)
*G01R 31/08* (2006.01)
(52) U.S. Cl. ....................... 324/713; 324/525
(58) Field of Classification Search ............ 324/713, 324/525
See application file for complete search history.

(56) References Cited

U.S. PATENT DOCUMENTS

| 4,228,394 A | 10/1980 | Crosby |
| 6,225,802 B1 | 5/2001 | Ramalho et al. |
| 6,812,715 B2 * | 11/2004 | Chiozzi et al. ............. 324/691 |
| 7,965,090 B2 * | 6/2011 | Kwak ....................... 324/713 |

FOREIGN PATENT DOCUMENTS

WO WO 2007/096796 8/2007

OTHER PUBLICATIONS

"Notification of Transmittal of the International Search Report and the Written Opinion of the International Searching Authority, or the Declaration", mailed Aug. 4, 2009, International Application No. PCT/US2009/002007, 13 pages.

* cited by examiner

*Primary Examiner* — Amy He
(74) *Attorney, Agent, or Firm* — Cesari and McKenna, LLP

(57) ABSTRACT

The present invention employs identically sized mirror transistors arrange in groups that may be preferentially addressed and activated to determine the value of a resistor. Known current are directed through the resistor, and the voltage developed is measured by comparing against a reference voltage. The current is increased or decreased by the least significant value until the voltage across the resistor matches the reference voltage. A successive approximation or other known technique may be used instead. A reference current is developed that temperature stable and that is trimmed when manufactured to reduce process effects. The reference voltage may be constructed to be independent form a local power source so that the system is relatively independent of process, voltage and temperature, PVT.

21 Claims, 4 Drawing Sheets

METHOD AND SYSTEM THAT DETERMINES THE VALUE OF A RESISTOR IN LINEAR AND NON-LINEAR RESISTOR SETS

RELATED APPLICATIONS

This application is related to and claims the benefit of the filing of provisional application Ser. No. 61/042,340, filed Apr. 4, 2008, entitled A Method and Apparatus to Determine the Value of a Non-Linear Resistor Set. This provisional application is of common ownership and inventorship, and is incorporated herein by reference.

BACKGROUND OF THE INVENTION

1. Field of the Invention

This application relates to systems that measure resistors that define particular accessories, and more particularly to measuring these resistors in accessories attached to mobile devices.

2. Background Information

Different vendors of accessories for mobile telephones and other mobile devices have built-in unique resistors values that identify the different accessories. When attached, the mobile device detects the value of the resistor that identifies the specific accessory. The operation of that accessory may then be executed without further actions by a human user.

Limitations exist when designing systems to measure these resistors. More specifically, the dynamic range of the resistors involved place limitations on minimum currents and/or voltages involved.

It would be advantageous to be able to determine automatically all the possible values of resistors in the external accessories.

SUMMARY OF THE INVENTION

The present invention provides an IDAC (current Digital to Analog Converter) designed to determine the values of external resistors that are built in to identify the accessories. For example, an audio or display accessory connected to a cell phone or other mobile device will present a specific resistor across specific cell phone contacts. The cell phone will measure the resistance to identify the accessory.

The IDAC outputs incremental currents that develop voltages across the external resistor. The voltages are compared to a reference voltage and the current changed until the voltages match. Illustratively, a current source is configured in multiples of a least significant bit (LSB) current and directed across the external resistor developing an external voltage. The system provides a known reference voltage, and the reference voltage is successively compared to the external voltage as the incremental current is changed. Note the incremental current may be positive or negative. Also note that the term "connected" is defined as "coupled" or "functionally connected" where other components by be inserted in the "connection" that do not interfere with the present invention.

Depending on the comparison, the IDAC output current is incremented sequentially. For example, a series of current sources may be addressed by five binary bits—the decimal equivalent for the five bits is 0 to 31. Each combination may activate one of 32 switches each of which connect a current associated with that switch to the external resistor.

If an accessory is connected to a mobile device, as mentioned above, it presents a specific external resistor identifying the accessory to the mobile device. A binary addressed series of current sources may be sequentially driven into the external resistor developing a voltage, Vext. Although the current sources may be addressed in a binary fashion, the current delivered from each addressed current need not be an increasing binary multiple. For example, a sequence of incremental currents may be multiples of the LSB current—such as X1 (one times the LSB), then X2 followed by X3, and, for example, followed by X1 again.

A reference voltage, Vref, is generated and Vext is compared to Vref. The comparison outcome is input to a controller that adjusts by either turning on the next current source in sequence, or determining that the last added current was enough and the binary code for the last current source added yields the value of the resistor and thus the accessory is identified. Additionally, the binary code may then be a pointer to the program (software) that drives the accessory.

The present invention may be applied to a linear set of resistors, but also to a non-linear set. For a linear set of external resistors the range might be from about 13 K ohms to 665 K ohms, or a scale of about 50/1. Illustratively, the LSB (least significant bit) IDAC current may be about 1.5 uA. For a non-linear set, however, the range may be 500/1, or from about 2 K ohms to about 1 M ohms. The difficulty lies with the accommodating the very large external resistors that require very small currents. In one embodiment, the LSB current from the IDAC is about 0.5 uA.

For the non-linear resistor set, current sources, like those employed for a linear resistor set, may be activated but reduced in current value by simultaneously activating current sinks. The current sinks subtract current from the sources and thus reduce the current reaching the external resistor.

Illustratively, when a multiple of the LSB current source is constructed, e.g. X5, a mirror transistor might be constructed five times larger than the LSB transistor. But a preferred present invention approach is to make five mirror transistors identically sized to the LSB transistor. Advantageously, it has been found that the multiple identically sized mirror transistors may be more precisely constructed compared to larger mirror transistors.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1A:
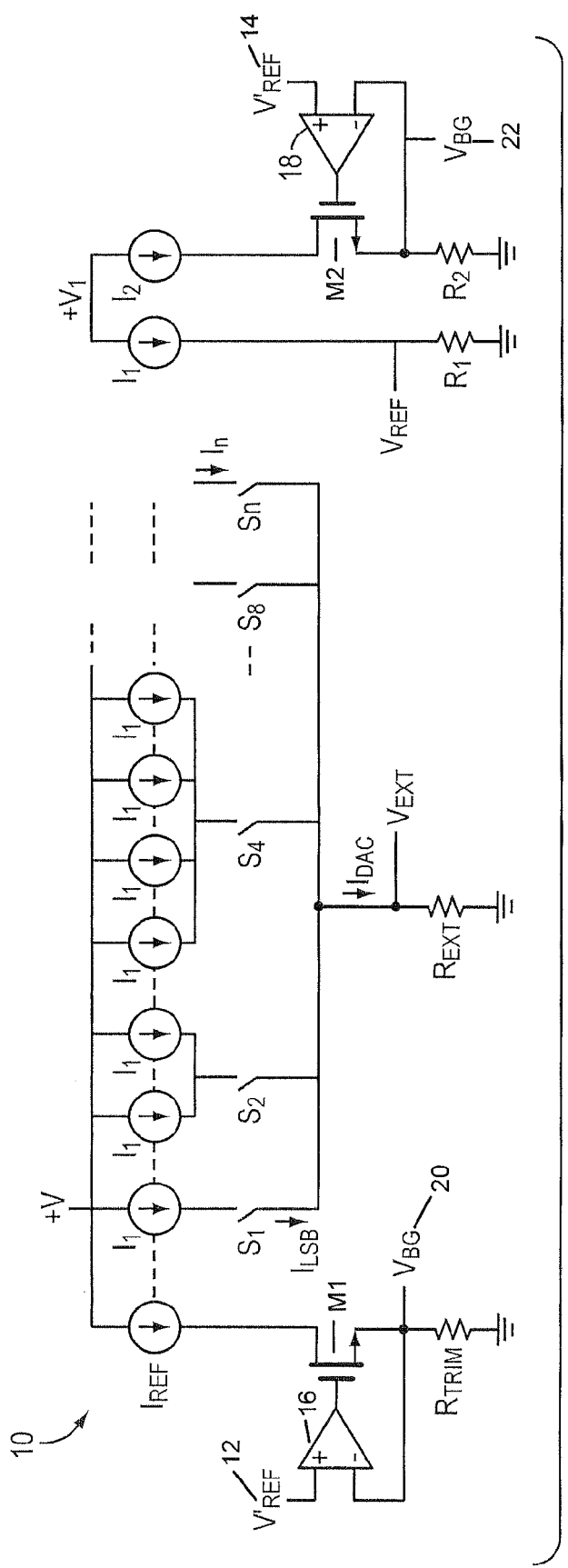
FIG. 1A is a schematic of a system employing current sources.

Linear DAC FIG. 1A.

If the external resistor set is based on a linear progression of resistance values, a linear IDAC 10 may be employed to measure the external resistance.

If the external resistor, Rext, belongs to a linear progression of resistors, then $R_{EXT}=mX$ where m is the slope and X is the unit resistance, and the external resistors will fall on a linear graph trace of Rext versus X. To determine the external resistor, use the following algorithm, see FIG. 1A: $V_{EXT}=I_{DAC}R_{EXT}$ $$I_{DAC} = N\frac{V_{BG}}{R_{TRIM}} = NI_{LBS}$$

where N $\{0, 1, 2, \ldots 2^n\}$, and $V_{BG}$ is a process independent voltage. In FIG. 1A $R_{TRIM}$ is an internal resistor that is trimmed during manufacture to supply a precision current of $I_{REF}$. $I_{REF}$ may be arranged as the least significant current ($I_{LSB}$), but $I_{REF}$ may be constructed as a multiple of $I_{LSB}$.

The trimming largely eliminates process variations and since $R_{TRIM}$ is constructed with a low temperature coefficient, the IDAC is independent of Process and Temperature. A reference voltage, $V_{REF}$, is constructed to be independent of the supply voltage, for example, a reference developed from a bandgap reference (known to those skilled in the art). When constructed in this manner the system is largely independent of PVT (Process, Voltage, Temperature) parameters. In FIG. 1A, a reference voltage V'REF is formed at 12 and 14 and via the operational amplifiers 16 and 18, and transistors M1 and M2, respectively, forming two versions of $V_{BG}$, 20 and 22. $V_{BG}$ 22 develops a current through R2, that is mirrored via I1 and I2 to develop a voltage across R1. That voltage is $V_{REF}$ and it is connected to one input of the comparator 24.

$$V_{REF} = \frac{V_{BG}R_1}{R_2} \text{ Setting } V_{REF} = V_{EXT} \text{ gives:}$$

$$\frac{V_{BG}R_1}{R_2} = N\frac{V_{BG}}{R_{TRIM}}R_{EXT} \text{ or } R_{EXT} = \frac{R_1 R_{TRIM}}{NR_2}$$

REXT is a resistance value of a ratio of resistors and a scalar N. Because R1 and R2 set the reference voltage they are consistent across PVT (Process, supply Voltage, and Temperature). As mentioned above, $R_{TRIM}$ is set at manufacture to have very low PVT.

A digital state machine, not shown, selects values of N in such a manner to find when the two voltages are equal within a tolerance (usually the LSB). This value of N then defines which value of external Resistance was connected. The design choice of N and $I_{LSB}$ are governed by the range of the external resistances. Generally the choice of $R_{EXT}$MAX would be used to define the choice of $I_{LSB}$ where $$I_{LSB} = \frac{V_{REF}}{R_{EXT}\text{MAX}},$$

if the slope of the resistances possible for Rext is $m=2^n$ then a binary weighted IDAC may directly determine the Rext value. In the case where $m \neq 2^n$, the values of Rext are not binary weighted, the $I_{LSB}$ would need to be determined per the smallest increment of consecutive external resistance values, or $$I_{LSB} = \frac{V_{BG}}{\Delta R_{EXTMIN}}.$$

On the left of FIG. 1A, V'ref forms $V_{BG}$ 20 at the output of operational amplifier 16. $V_{BG}$ 20 divided by the settable Rtrim defined Iref. In a binary arrangement, $I_{REF}$ is mirrored 10 at the single I1 connected through S1 to the $R_{EXT}$: then switch S2 connects two I1 mirrors; then S4 connects four I1 mirrors, and so forth.

Figure 1B:
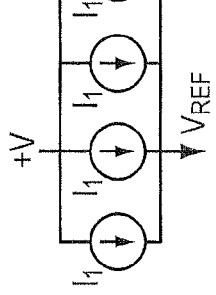
FIG. 1B is a schematic segments showing one possible configuration of multiple current sources.

Notice that the switches may be addressed in binary, but the currents need not be. For example, in FIG. 1B, three I1's are connected through the switch S3. There may, however, be only one I1 or many more connected to S3.

Figure 1C:
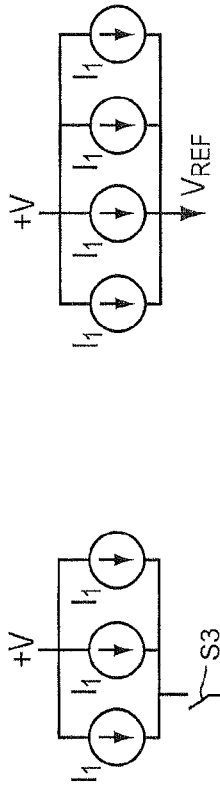
FIG. 1C is a schematic segment illustrating multiple sources for a reference current.

FIG. 1C illustrates that the $I_{REF}$ may be formed from multiples of the $I_{LSB}$. For example, if Rtrim set the $I_{REF}$ current to be precisely 2.0 uA, and there were four identically sized transistors all in parallel, as shown in FIG. 1C, precisely 0.5 uA would flow through each. Then a same sized mirror of one of these transistors would carry 0.5 uA, and that would form the LSB current. The mirrors connected by the switches (S1-Sn) may, as discussed herein, each have many more parallel same sized transistors to deliver a multiple of the LSB current. For example, switch S8 of FIG. 1A, may have eight mirrors delivering 4.0 uA to the $I_{DAC}$.

The current mirrors, I1 to In are directed to Rext by like labeled switches.

Figure 1D:
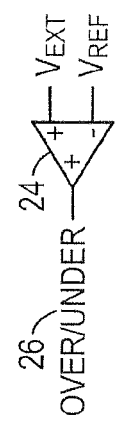
FIG. 1D is a schematic illustrating generation of an over/under signal.

The state machine, again not shown, accepts the over/under output from the comparator 24 (FIG. 1D) and adjusts the switch contacts S1, S2, S4, S8, S16 accordingly. In one example of FIG. 1, $V_{REF}$ is set at 2V, $I_{REF}$ at the $I_{LSB}$ at 1.5 uA, and N has the values of 0 to 31, where Sn is a five bit binary code, 00000 to 11111. In this case, there are switches S1, S2, S4, S8, and S16.

In this example, with no switches activated, no current flows through Rext and $V_{EXT}$ is zero. This starting point of the smallest current first has the advantage of expending the minimum power. $V_{REF}$ is higher than $V_{EXT}$ and over/under 26 is low. The state machine may activate S1 driving $I_{LSB}$ through $R_{EXT}$. The 1.5 uA flows through Rext and develops a $V_{EXT}$. If $V_{EXT}$ remains lower than $V_{REF}$, the over/under 26 goes low, the state machine resets S1, a turns on S2, and tests over/under again. Here two time the $I_{LSB}$ is delivered to $R_{EXT}$ doubling $V_{EXT}$. If over/under remains low, the state machine leaves S2 on, turns on S1 again so that three time $I_{LSB}$ is delivered to $R_{EXT}$ tripling $V_{EXT}$. This continues in a binary fashion, adding an $I_{LSB}$ each time until an adding causes the over/under to go high. At that point the binary value of the switches turned on indicates the values of the $R_{EXT}$. As mentioned above that value may point directly to a program to handle the accessory.

As known to those skilled in the art, other algorithms may be used to find the value of the $R_{EXT}$. Most notably, successive approximations, where the remaining range for each try is halved, is commonly used. Note again that the incremental changes may be positive or negative.

In practical examples, the higher the $R_{EXT}$ value the smaller the binary number, so that the linear resistance curve has a negative slope of $V_{EXT}$ against $R_{EXT}$. So if $R_{EXT}$ is a short circuit, all the current source switches will be turned on but the $V_{EXT}$ will remain lower than $V_{REF}$ (say $V_{REF}$ is 2 V). The resulting binary code for a $R_{EXT}$ of zero ohms will be 11111, or decimal 31. Similarly, when $R_{EXT}$ is it maximum value, say 665 K ohms, each of the switches S16, S8, S4 will be reset. S2 on will drive 3.0 uA through 665 K ohms and that will be slightly (1.995 V) less than 2.0 V. So S2 will be on and S1 will be off. The result is a binary code of 00010, or decimal 2.

In practice with the process in use, an LSB of 0.5 to 2.0 uA is reasonable with a Vref of 2.0 V and a resistor set running from values of about 12.7 K to 665 K ohms.

Figure 2:
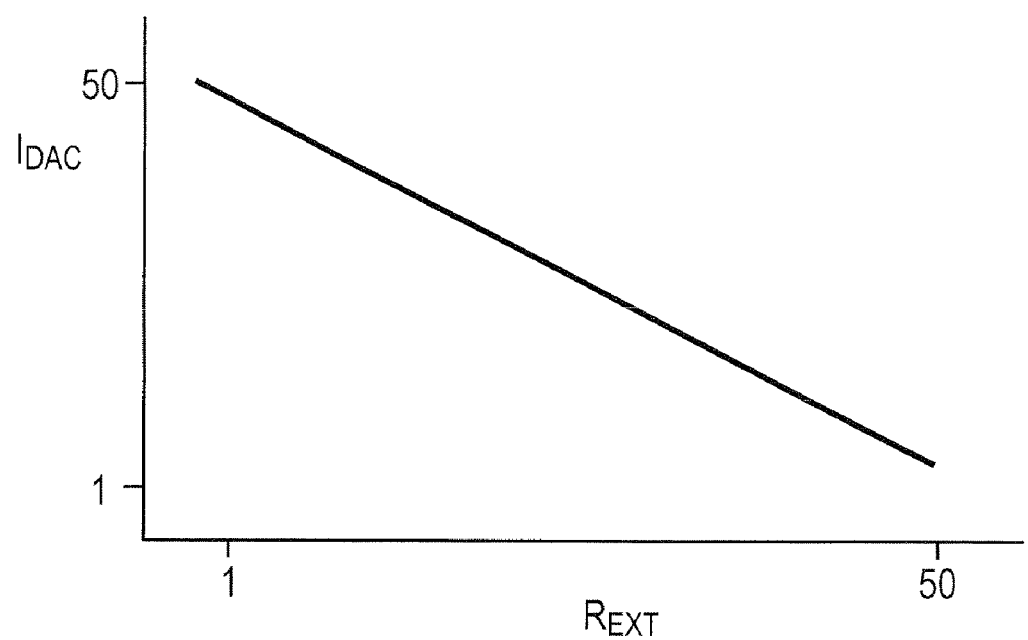
FIGS. 2 and 3 are graphical profiles of resistor sets.

FIG. 2 illustrates the negative slope showing I$_{DAC}$ decreasing as R$_{EXT}$ increases. A 50/1 dynamic range for the R$_{EXT}$ and I$_{DAC}$ is depicted.

Non-Linear Resistor Sets

Different mobile device makers may choose non-linear resistor sets. This makes the design of the detection circuit more difficult. The difficulty lies in that the choice of the external resistors forces the use of very small currents in the I$_{DAC}$. An example of such a resistor set is characterized below.

Note that in this resistor set the range is 2 KΩ to 1000 KΩ. This is a dynamic range of 500/1 (compared to the linear example of 50/1).

Figure 3:
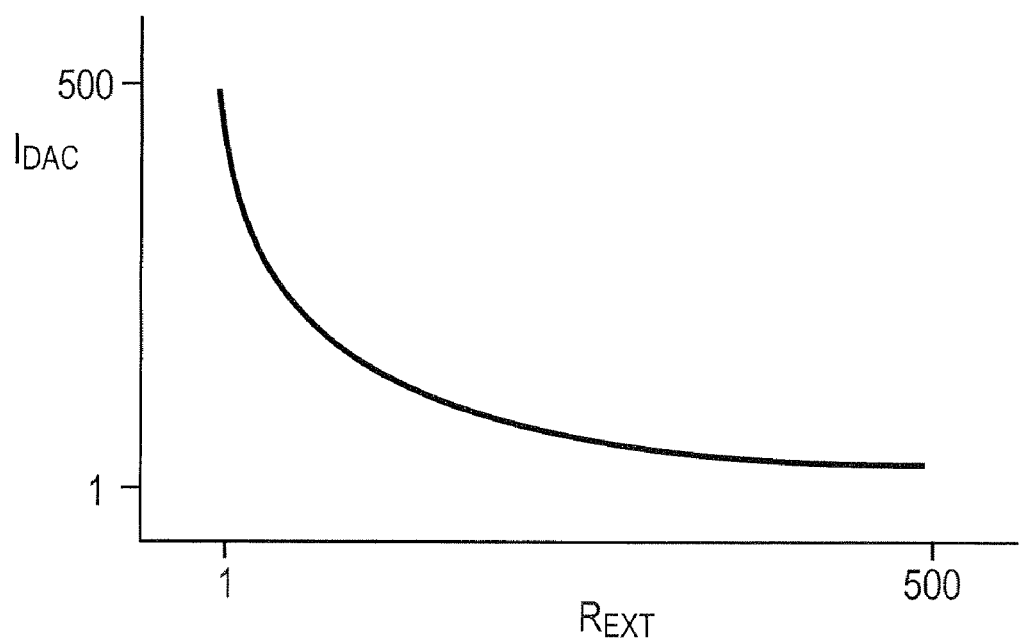

FIG. 3 illustrates a non-linear curve I$_{DAC}$ to R$_{EXT}$ curve is illustrated depicting a 500/1 dynamic range for the R$_{EXT}$ and I$_{DAC}$. The range of R$_{EXT}$ might run from about 2 K Ohms to about 1 M ohm. An equation for an example of this curve is:

$$y(\text{current}) = 1149.6 e^{-0.2045x}.$$

Non-Linear Resistor Solution

The linear algorithm must be modified to resolve the non-linear example. The problem with the non-linear is that the currents are low valued and finding a common value that would scale is problematic. At the low value of resistors there is no problem with the initial architecture. The problem lies in the higher resistor values. This is because the spacing of the resistors and the current required to hit the target reference voltage becomes difficult to achieve. By adding a set of precision sink currents to the circuit, the higher value resistors are resolved, and lower valued accessories may be resolved as in the linear case.

To evaluate the higher valued resistors the following relationship is employed;

$$V_{EXT} = I_{LSB}(n-k) R_{EXT}.$$

Figure 4:
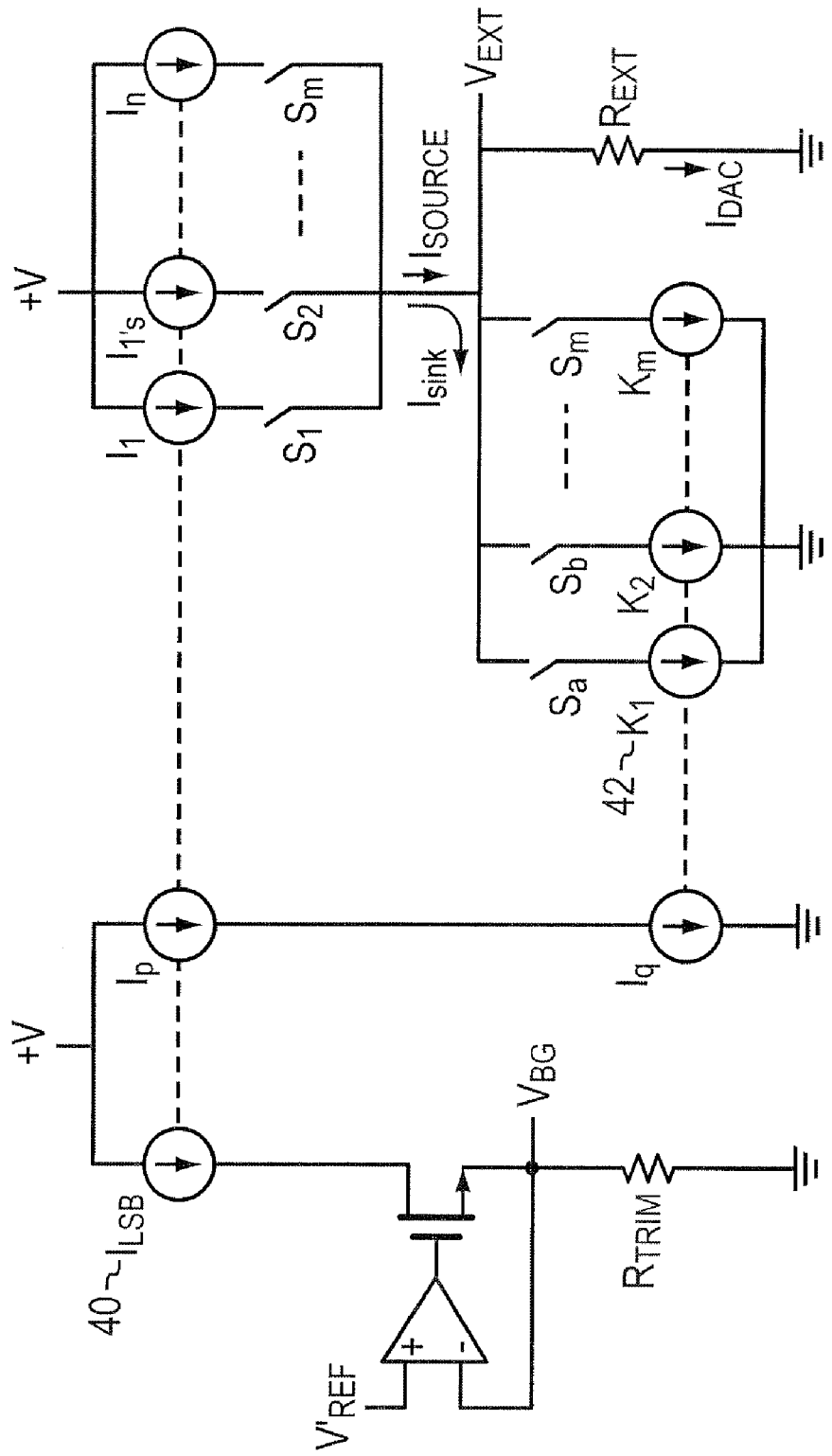
FIG. 4 is a schematic illustrating use of current sinks.

In FIG. 4 the trimmed precision I$_{LSB}$ (Iref) current 40 is mirrored down via Ip and Iq to a set of k current sinks 42. Here Ip and Iq are the LSB current, but the K1, K2, and K3 mirrors may be multiple parallel current sources as shown for FIG. 1A above. The summing junction of the currents is the point where the currents from the sources (I1's) and the sinks (k's) converge to produce I$_{DAC}$ through the external resistor to form V$_{EXT}$. The system constructs a number, n, current sources, and a number, m, current sinks. The sink current subtract from the source currents to form the I$_{DAC}$ current through R$_{EXT}$ to form V$_{EXT}$. Using the prior example with a V$_{REF}$ of 2.0 V, if a current of 0.5 uA was needed to yield V$_{EXT}$ of 2.0 V, the source current might be 16 uA while the sink current might be 15.5 uA to yield a I$_{DAC}$ current of 0.5 uA. If the R$_{EXT}$ were 4.0 M ohms, V$_{EXT}$ would the 2.0 V.

In one application, with the value of n predetermined, the value of k may be selected to reliably distinguish a non-linear resistor se, as would be known to those skilled in the art.

Figure 5:
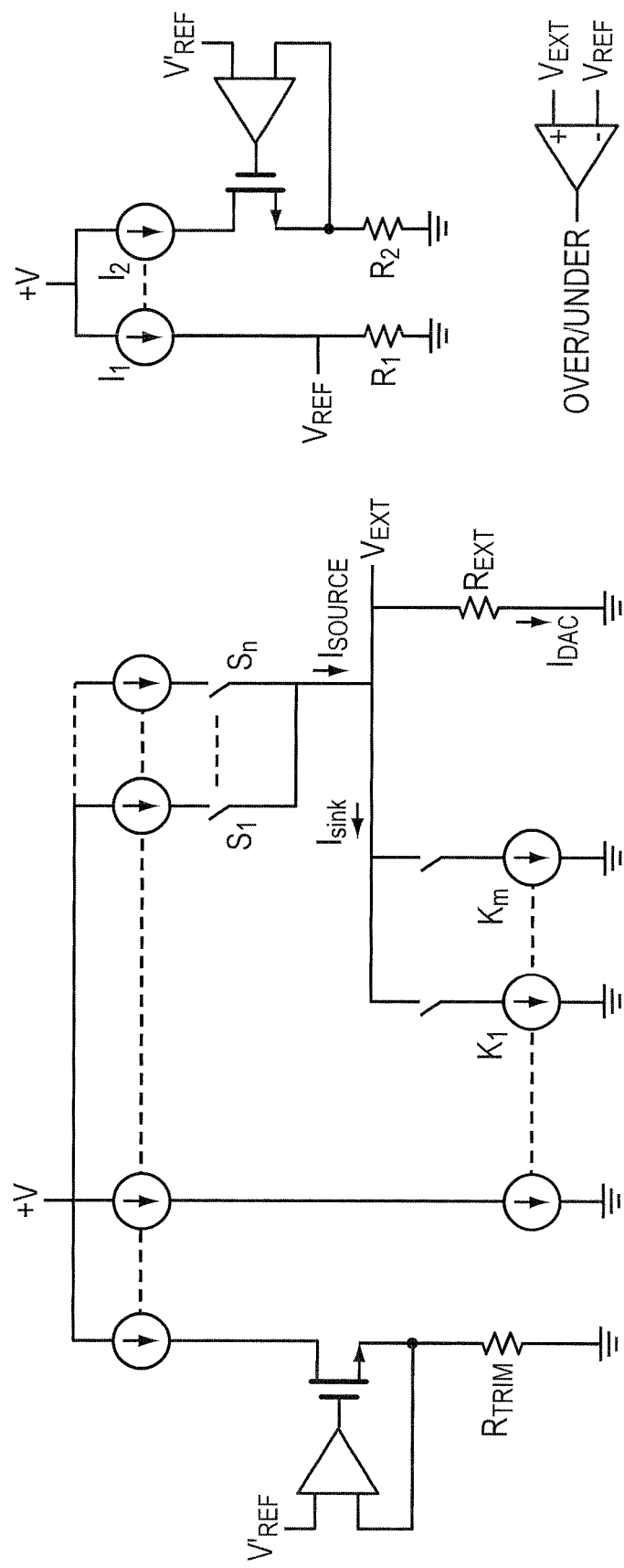
FIG. 5 is a schematic of a system employing current sinks and sources.

FIG. 5 illustrates the completed circuit of current source and current sinks.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. A system for identifying a resistor from a set of resistors, the system comprising:
a first current source carrying a current of a least significant value;
a set of parallel current sources, each mirrored from the first current source;
a set of addressable switches, each switch defining an input and an output, with one switch input connected to each current source in the set of parallel current sources; and with the switch outputs connected together and to the resistor being identified;
addressed drivers that activate the addressable switches; wherein when activated current runs through the resistor being identified creating a first voltage;
a reference voltage;
a comparator with one input being the first voltage and the other being the reference voltage, wherein the comparator output determines which input is higher than the other, and wherein the addressed drivers are changed so that a different current runs through the resistor.

2. The system of claim 1 further comprising;
a settable reference current;
a trimmable resistor constructed to set the reference current;
two or more identically sized transistors arranged in parallel so that each of the two or more transistors divide the settable reference current equally; wherein the first current source comprises one of the two or more identically sized transistors.

3. The system of claim 1 wherein the first current source defines a specifically sized transistor and the set of parallel current sources mirrored from the first current source are transistors that are identically sized to the specifically sized transistor.

4. The system of claim 1 further comprising a state machine that accepts the comparator output and, in response thereto, activates the addressable switches, wherein the current through the resistor being determined is incremented, and wherein in response the state machine successively accepts the comparator outputs.

5. The system of claim 4 wherein the state machine activates the addressable switches in a sequence, consistent with the value of the current sources, wherein the incremental current through the resistor being determined is changed by the least significant current.

6. The system of claim 4 wherein the state machine activates the addressable switches in a successive approximation sequence.

7. The system of claim 1 wherein the values of the resistors being determined follow a linear profile.

8. The system of claim 1 wherein the set of parallel current sources is binary weighted.

9. The system of claim 1 further comprising:
a second set of parallel current sinks, each mirrored from the first current source;
a second set of addressable switches, each switch defining an input and an output, with one switch input connected to each current sink in the second set of parallel current sinks; and with the switch outputs connected together and to the resistor being identified;
second addressed drivers that activate the second set addressable switches; wherein when activated current from the parallel current sinks subtracts from the first set of current sources to form the current that runs through the resistor being identified to form the first voltage.

10. The system of claim 9 further comprising a state machine that changes the activation of the first and the second set of addressable switches in response to the comparator output.

11. The system of claim 9 wherein the values of the resistors being determined follow a non-linear profile.

12. A method for identifying a resistor from a set of resistors, the method comprising the steps of:
creating a first current source of a least significant value;
mirroring the first current source producing a set of parallel current sources;
connecting each current source in the set of current sources to an addressable switch input, and connecting the switch outputs together and to the resistor being identified;
activating the addressable switches; wherein when activated current runs through the resistor being identified creating a first voltage;
comparing the first voltage to a reference voltage, wherein the comparing determines which input is higher than the other, and wherein the addressed drivers are changed so that a different current runs through the resistor.

13. The method of claim 12 further comprising the steps of:
setting a reference current;
sizing two or more transistors equally and arranging them in parallel so that each of the two or more transistors divide the settable reference current equally; wherein the first current source comprises one of the two or more identically sized transistors.

14. The method of claim 12 wherein the first current source defines a specifically sized transistor and the set of parallel current sources mirrored from the first current source are transistors that are identically sized to the specifically sized transistor.

15. The method of claim 12 further comprising the steps of:
incrementing or decrementing the current through the resistor being determined and incrementing or decrementing the first voltage; and, in response thereto, activating the addressable switches, wherein the current through the resistor being determined is changed, and wherein in response the state machine successively accepts the comparator outputs.

16. The method of claim 15 wherein the activating of the addressable switches occurs in a sequence consistent with the value of the parallel current sources, wherein the incremental current through the resistor being determined is changed by the least significant current.

17. The method of claim 15 wherein the activating of the addressable switches occurs in a successive approximation sequence.

18. The method of claim 12 wherein the values of the resistors being determined follow a linear profile.

19. The method of claim 12 further comprising the step of binary weighting the second set of current sources.

20. The method of claim 12 further comprising the steps of:
second mirroring of the first set of parallel current sources to create a second set of parallel current sinks;
connecting the second set of parallel current sinks to a second set of addressable switches, and connecting the outputs of the second set of addressable switches together and to the resistor being identified;
activating the second set addressable switches; wherein when activated current from the current sinks subtracts from the first set of parallel current sources to form the current that runs through the resistor being identified to form the first voltage;
comparing the first voltage to a reference voltage, wherein the comparing determines which input is higher than the other, and wherein the second set of addressable switches changed so that a different current runs through the resistor being identified.

21. The method of claim 20 further comprising the step of changing the activation of the first and the second set of addressable switches in response the comparing.

* * * * *